United States Patent
Luo et al.

(10) Patent No.: US 11,416,735 B2
(45) Date of Patent: Aug. 16, 2022

(54) NEURAL NETWORKS AND SYSTEMS FOR DECODING ENCODED DATA

(71) Applicant: MICRON TECHNOLOGY, INC., Boise, ID (US)

(72) Inventors: Fa-Long Luo, San Jose, CA (US); Jaime Cummins, Bainbridge Island, WA (US); Tamara Schmitz, Scotts Valley, CA (US)

(73) Assignee: Micron Technology, Inc., Boise, ID (US)

( * ) Notice: Subject to any disclaimer, the term of this patent is extended or adjusted under 35 U.S.C. 154(b) by 286 days.

(21) Appl. No.: 16/839,447

(22) Filed: Apr. 3, 2020

(65) Prior Publication Data

US 2020/0234103 A1    Jul. 23, 2020

Related U.S. Application Data

(63) Continuation of application No. 16/233,576, filed on Dec. 27, 2018.

(51) Int. Cl.
*G06N 3/04* (2006.01)
*H03M 13/11* (2006.01)
(Continued)

(52) U.S. Cl.
CPC ........... *G06N 3/0472* (2013.01); *G06F 17/18* (2013.01); *G06K 9/6223* (2013.01); *G06N 3/08* (2013.01);
(Continued)

(58) Field of Classification Search
CPC ........ G06N 3/0472; G06N 3/08; G06F 17/18; G06K 9/6223; H03M 13/1102; H03M 13/1515; H03M 13/152
See application file for complete search history.

(56) References Cited

U.S. PATENT DOCUMENTS 7,321,882 B2    1/2008    Jaeger
9,988,090 B2    6/2018    Nishikawa
(Continued)

FOREIGN PATENT DOCUMENTS

KR    20180054554 A    5/2018
KR    20180084988 A    7/2018
(Continued)

OTHER PUBLICATIONS

U.S. Appl. No. 17/302,226, titled "Decoders and Systems for Decoding Encoded Data Using Neural Networks", filed Apr. 27, 2021.

(Continued)

*Primary Examiner* — Kyle Vallecillo
(74) *Attorney, Agent, or Firm* — Dorsey & Whitney LLP

(57) ABSTRACT

Examples described herein utilize multi-layer neural networks to decode encoded data (e.g., data encoded using one or more encoding techniques). The multi-layer neural networks include an encoder configured to encode input data using encoded bits in accordance with an encoding technique and to provide encoded input data, and a memory configured to receive the encoded input data from the encoder and configured to store the encoded input data. The multi-layer neural networks further include combiners configured to receive the encoded input data from the memory and further configured to combine the encoded input data among a set of predetermined weights. The combiners are further configured to provide encoded data with reduced noise, the noise introduced by the memory.

20 Claims, 4 Drawing Sheets

(51) Int. Cl.
*H03M 13/15* (2006.01)
*G06K 9/62* (2022.01)
*G06F 17/18* (2006.01)
*G06N 3/08* (2006.01)

(52) U.S. Cl.
CPC ..... *H03M 13/1102* (2013.01); *H03M 13/152* (2013.01); *H03M 13/1515* (2013.01)

(56) References Cited

U.S. PATENT DOCUMENTS

| | | | |
|---|---|---|---|
| 10,176,802 | B1 | 1/2019 | Ladhak et al. |
| 10,400,928 | B2 | 9/2019 | Baldwin et al. |
| 10,552,738 | B2 | 2/2020 | Holt et al. |
| 10,698,657 | B2 | 6/2020 | Kang et al. |
| 10,749,594 | B1 | 8/2020 | O'Shea et al. |
| 10,812,449 | B1* | 10/2020 | Cholleton ............... G06N 3/02 |
| 11,088,712 | B2 | 8/2021 | Zamir et al. |
| 11,196,992 | B2 | 12/2021 | Huang et al. |
| 2004/0015459 | A1 | 1/2004 | Jaeger |
| 2006/0013289 | A1 | 1/2006 | Hwang |
| 2006/0200258 | A1 | 9/2006 | Hoffberg et al. |
| 2009/0292537 | A1 | 11/2009 | Ehara et al. |
| 2017/0310508 | A1 | 10/2017 | Moorti et al. |
| 2017/0370508 | A1 | 12/2017 | Baldwin et al. |
| 2018/0022388 | A1 | 1/2018 | Nishikawa |
| 2018/0046897 | A1 | 2/2018 | Kang et al. |
| 2018/0174050 | A1 | 6/2018 | Holt et al. |
| 2018/0249158 | A1 | 8/2018 | Huang et al. |
| 2018/0322388 | A1 | 11/2018 | O'Shea |
| 2018/0357530 | A1* | 12/2018 | Beery ................. G06N 3/0454 |
| 2019/0197549 | A1 | 6/2019 | Sharma |
| 2020/0012953 | A1 | 1/2020 | Sun et al. |
| 2020/0065653 | A1 | 2/2020 | Meier et al. |
| 2020/0160838 | A1 | 5/2020 | Lee |
| 2020/0210816 | A1 | 7/2020 | Luo et al. |
| 2020/0296741 | A1 | 9/2020 | Ayala Romero et al. |
| 2021/0143840 | A1 | 5/2021 | Luo |
| 2021/0273707 | A1 | 9/2021 | Yoo et al. |
| 2021/0287074 | A1 | 9/2021 | Coenen |
| 2021/0319286 | A1* | 10/2021 | Gunduz ............... G06N 3/0472 |
| 2021/0336779 | A1 | 10/2021 | Jho et al. |
| 2021/0351863 | A1* | 11/2021 | Gunduz ............... H04L 1/0009 |

FOREIGN PATENT DOCUMENTS

| | | |
|---|---|---|
| WO | 2020139976 A1 | 7/2020 |
| WO | 2021096641 A1 | 5/2021 |

OTHER PUBLICATIONS

U.S. Appl. No. 17/302,228, titled "Systems for Error Reduction of Encoded Data Using Neural Networks", filed Apr. 27, 2021.

U.S. Appl. No. 17/496,703 titled "Systems for Estimating Bit Error Rate (BER) of Encoded Data Using Neural Networks" filed Oct. 7, 2021, pp. all pages of application as filed.

Sun, Yang, et al., "VLSI Architecture for Layered Decoding of QC-LDPC Codes With High Circulant Weight" IEEE Transactions on Very Large Scale Integration (VLSI) Systems, vol. 21, No. 10, pp. 1960-1964, Oct. 2013.

International Application No. PCT/US19/68616, titled "Neural Networks and Systems for Decoding Encoded Data", filed Dec. 26, 2019, pp. all.

U.S. Appl. No. 16/683,217, titled "Recurrent Neural Networks and Systems for Decoding Encoded Data", filed Nov. 13, 2019, pp. all.

U.S. Appl. No. 16/233,576 titled "Neural Networks and Systems for Decoding Encoded Data" filed Dec. 27, 2018; pp. all.

International Search Report and Written Opinion for Application No. PCT/US2019/068616, dated Apr. 27, 2020.

PCT Application PCT/US20/56151 titled "Recurrent Neural Networks and Systems for Decoding Encoded Data" filed Oct. 16, 2020.

Kim, Minhoe et al. "Building Encoder and Decoder With Deep Neural Networks: On the Way to Reality", Retrieved from <https://arxiv.org/abs/1808.02401 >, dated Aug. 7, 2018, p. 4-5.

Lipton, Zachary C. et al., "A Critical Review of Recurrent Neural Networks for Sequence Learning", Retrieved from https://arxiv.org/abs/1506.00019v4, Oct. 17, 2015.

Huo et al. "A Tutorial and Review on Inter-Layer FEC Coded Layered Video Streaming" in IEEE Communications Survey & Tutorials, vol. 17, No. 2, 2nd Quarter 2015; pp. 1166-1207.

* cited by examiner

US 11,416,735 B2

NEURAL NETWORKS AND SYSTEMS FOR DECODING ENCODED DATA

CROSS REFERENCE TO RELATED APPLICATION(S)

This application is a continuation of pending U.S. patent application Ser. No. 16/233,576 filed Dec. 27, 2018. The aforementioned application is incorporated herein by reference, in its entirety, for any purpose.

TECHNICAL FIELD

Examples described herein relate to neural networks for use in decoding encoded data. Examples of neural networks are described which may be used with error-correcting coding (ECC) memory, where a neural network may be used to decode encoded data.

BACKGROUND

Error correction coding (ECC) may be used in a variety of applications, such as memory devices or wireless baseband circuitry. Generally, error correction coding techniques may encode original data with additional bits to describe the original bits which are intended to be stored, retrieved, and/or transmitted. The additional bits may be stored together with the original bits. Accordingly, there may be L bits of original data to be stored and/or transmitted. An encoder may provide N-L additional bits, such that the encoded data may be N bits worth of data. The original bits may be stored as the original bits, or may be changed by the encoder to form the encoded N bits of stored data. A decoder may decode the N bits to retrieve and/or estimate the original L bits, which may be corrected in some examples in accordance with the ECC technique.

DETAILED DESCRIPTION

Multi-layer neural networks may be used to decode encoded data (e.g., data encoded using one or more encoding techniques). The neural networks may have nonlinear mapping and distributed processing capabilities which may be advantageous in many systems employing the neural network decoders. In this manner, neural networks described herein may be used to implement error code correction (ECC) decoders.

An encoder may have L bits of input data (a1, a2, . . . aL). The encoder may encode the input data in accordance with an encoding technique to provide N bits of encoded data (b1, b2, . . . bN). The encoded data may be stored and/or transmitted, or some other action taken with the encoded data, which may introduce noise into the data. Accordingly, a decoder may receive a version of the N bits of encoded data (x1, x2, . . . xN). The decoder may decode the received encoded data into an estimate of the L bits original data (y1, y2, . . . yL).

Examples of wireless baseband circuitry may utilize error correction coding (such as low density parity check coding, LDPC). An encoder may add particularly selected N-L bits into an original data of L bits, which may allow a decoder to decode the data and reduce and/or minimize errors introduced by noise, interferences and other practical factors in the data storage and transmission.

There are a variety of particular error correction coding techniques, including low density parity check coding (LDPC), Reed-Solomon coding, Bose-Chaudhuri-Hocquenghem (BCH), and Polar coding. The use of these coding techniques, however, may come at the cost of the decrease of the frequency and/or channel and/or storage resource usage efficiency and the increase of the processing complexity. For example, the use of coding techniques may increase the amount of data which may be stored and/or transmitted. Moreover, processing resources may be necessary to implement the encoding and decoding. In some examples, the decoder may be one of the processing blocks that cost the most computational resources in wireless baseband circuitry and/or memory controllers, which may reduce the desirability of existing decoding schemes in many emerging applications such as Internet of Things (IoT) and/or tactile internet where ultra-low power consumption and ultra-low latency are highly desirable.

Examples described herein utilize multi-layer neural networks to decode encoded data (e.g., data encoded using one or more encoding techniques). The neural networks have nonlinear mapping and distributed processing capabilities which may be advantageous in many systems employing the neural network decoders.

Figure 1:
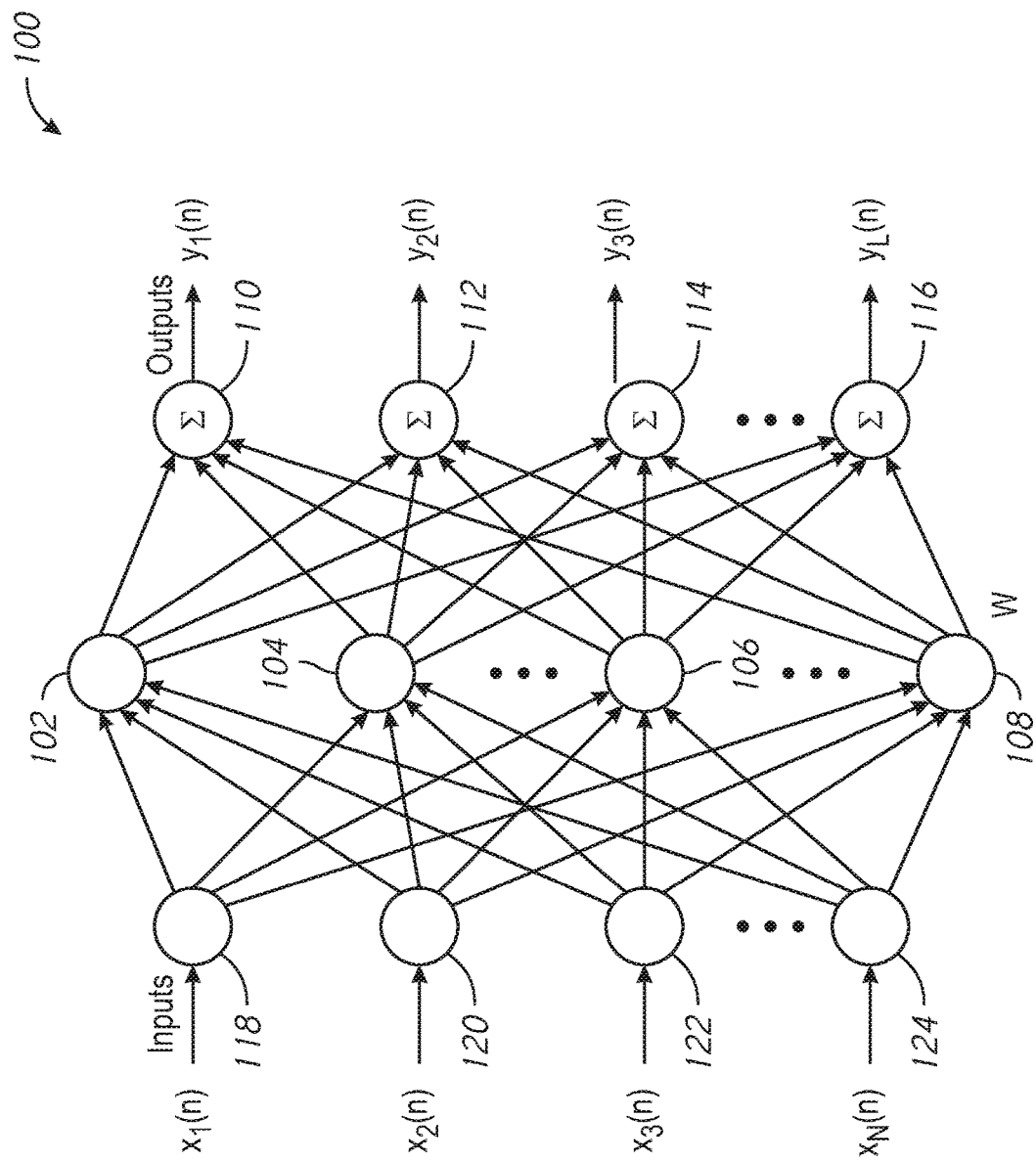
FIG. 1 is a schematic illustration of a neural network arranged in accordance with examples described herein.

FIG. 1 is a schematic illustration of a neural network arranged in accordance with examples described herein. The neural network 100 include three stages (e.g., layers) While three stages are shown in FIG. 1, any number of stages may be used in other examples. A first stage of neural network 100 includes node 118, node 120, node 122, and node 124. A second stage of neural network 100 includes combiner 102, combiner 104, combiner 106, and combiner 108. A third stage of neural network 100 includes combiner 110, combiner 112, combiner 114, and combiner 116. Additional, fewer, and/or different components may be used in other examples.

Generally, a neural network may be used including multiple stages of nodes. The nodes may be implemented using processing elements which may execute one or more functions on inputs received from a previous stage and provide the output of the functions to the next stage of the neural network. The processing elements may be implemented using, for example, one or more processors, controllers, and/or custom circuitry, such as an application specific integrated circuit (ASIC) and/or a field programmable gate array (FPGA). The processing elements may be implemented as combiners and/or summers and/or any other structure for performing functions allocated to the processing element. In some examples, certain of the processing elements of neural networks described herein perform weighted sums, e.g., may be implemented using one or more multiplication/accumulation units, which may be implemented using processor(s) and/or other circuitry.

In the example, of FIG. 1, the neural network 100 may have an input layer, which may be a first stage of the neural network including node 118, node 120, node 122, and node 124. The nodes node 118, node 120, node 122, and node 124 may implement a linear function which may provide the input signals (e.g., x1(*n*), x2(*n*), . . . xN(*n*)) to another stage of the neural network (e.g., a 'hidden stage' or 'hidden layer'). Accordingly, in the example of FIG. 1, N bits of input data may be provided to an input stage (e.g., an input layer) of a neural network during operation. In some examples, the input data may be data encoded in accordance with an encoding technique e.g., low density parity check coding (LDPC), Reed-Solomon coding, Bose-Chaudhuri-Hocquenghem (BCH), and/or Polar coding). The N bits of input data may be output by the first stage of the neural network 100 to a next stage of the neural network 100. In some examples, the connection between the first stage and the second stage of the neural network 100 may not be weighted—e.g., processing elements in the second stage may receive bits unaltered from the first stage in some examples. Each of the input data bits may be provided to multiple ones of the processing elements in the next stage. While an input layer is shown, in some examples, the input layer may not be present.

The neural network 100 may have a next layer, which may be referred to as a 'hidden layer' in some examples. The next layer may include combiner 102, combiner 104, combiner 106, and combiner 108, although any number of elements may be used. While the processing elements in the second stage of the neural network 100 are referred to as combiners, generally the processing elements in the second stage may perform a nonlinear activation function using the input data bits received at the processing element. Any number of nonlinear activation functions may be used. Examples of functions which may be used include Gaussian functions, such as $$f(r) = \exp\left(-\frac{r^2}{\sigma^2}\right).$$

Examples of functions which may be used include multi-quadratic functions, such as $f(r)=(r^2+\sigma^2)^{1/2}$. Examples of functions which may be used include inverse multi-quadratic functions, such as $f(r)=(r^2+\sigma^2)^{-1/2}$. Examples of functions which may be used include thin-plate-spline functions, such as $f(r)=r^2 \log(r)$. Examples of functions which may be used include piece-wise linear functions, such as $f(r)=\frac{1}{2}(|r+1|-|r-1|)$. Examples of functions which may be used include cubic approximation functions, such as $f(r)=\frac{1}{2}(|r^3+1|-|r^3-1|)$. In these example functions, σ represents a real parameter (e.g., a scaling parameter) and r is the distance between the input vector and the current vector. The distance may be measured using any of a variety of metrics, including the Euclidean norm.

Each element in the 'hidden layer' may receive as inputs selected bits (e.g., some or all) of the input data. For example, each element in the 'hidden layer' may receive as inputs from the output of multiple selected elements (e.g., some or all elements) in the input layer. For example, the combiner 102 may receive as inputs the output of node 118, node 120, node 122, and node 124. While a single 'hidden layer' is shown by way of example in FIG. 1, any number of 'hidden layers' may be present and may be connected in series. While four elements are shown in the 'hidden layer', any number may be used, and they may be the same or different in number than the number of nodes in the input layer and/or the number of nodes in any other hidden layer. The nodes in the hidden layer may evaluate at least one non-linear function using combinations of the data received at the hidden layer node (e.g., element). In this manner, the hidden layer may provide intermediate data at an output of one or more hidden layers.

The neural network 100 may have an output layer. The output layer in the example of FIG. 1 may include combiner 110, combiner 112, combiner 114, and combiner 116, although any number of elements may be used. While the processing element in the output stage of the neural network 100 are referred to as combiners, generally the processing elements in the output may perform any combination or other operation using data bits received from a last 'hidden layer' in the neural network. Each element in the output layer may receive as inputs selected bits (e.g., some or all) of the data provided by a last 'hidden layer'. For example, the combiner 110 may receive as inputs from the outputs of combiner 102, combiner 104, combiner 106, and combiner 108. The connections between the hidden layer and the output layer may be weighted. For example, a set of weights W may be specified. There may be one weight for each connection between a hidden layer node and an output layer node in some examples. In some examples, there may be one weight for each hidden layer node that may be applied to the data provided by that node to each connected output node. Other distributions of weights may also be used. The weights may be multiplied with the output of the hidden layer before the output is provided to the output layer. In this manner, the output layer may perform a sum of weighted inputs. Accordingly, an output of the neural network 100 (e.g., the outputs of the output layer) may be referred to as a weighted sum. The output layer may accordingly combine intermediate data received from one or more hidden layers using weights to provide output data.

In some examples, the neural network 100 may be used to provide L output bits which represent decoded data corresponding to N input bits. For example, in the example of FIG. 1, N input bits are shown ($x_1(n)$, $x_2(n)$, . . . $x_N(n)$) and L output bits are provided ($y_1(n)$, $y_2(n)$, . . . $y_L(n)$). The neural network 100 may be trained such that the weights W used and/or the functions provided by the elements of the hidden layers cause the neural network 100 to provide output bits which represent the decoded data corresponding to the N encoded input bits. The input bits may have been encoded with an encoding technique, and the weights and/or functions provided by the elements of the hidden layers may be selected in accordance with the encoding technique. Accordingly, the neural network 100 may be trained multiple times—once for each encoding technique that may be used to provide the neural network 100 with input data.

Examples of neural networks may be trained. Training generally refers to the process of determining weights, functions, and/or other attributes to be utilized by a neural network to create a desired transformation of input data to output data. In some examples, neural networks described herein may be trained to transform encoded input data to decoded data (e.g., an estimate of the decoded data). In some examples, neural networks described herein may be trained to transform noisy encoded input data to decoded data (e.g., an estimate of the decoded data). In this manner, neural networks may be used to reduce and/or improve errors which may be introduced by noise present in the input data. In some examples, neural networks described herein may be trained to transform noisy encoded input data to encoded data with reduced noise. The encoded data with reduced noise may then be provided to any decoder (e.g., a neural network and/or other decoder) for decoding of the encoded data. In this manner, neural networks may be used to reduce and/or improve errors which may be introduced by noise.

Training as described herein may be supervised or unsupervised in various examples. In some examples, training may occur using known pairs of anticipated input and desired output data. For example, training may utilize known encoded data and decoded data pairs to train a neural network to decode subsequent encoded data into decoded data. In some examples, training may utilize known noisy encoded data and decoded data pairs to train a neural network to decode subsequent noisy encoded data into decoded data. In some examples, training may utilize known noisy encoded data and encoded data pairs to train a neural network to provide encoded data having reduced noise than input noisy encoded data. Examples of training may include determining weights to be used by a neural network, such as neural network 100 of FIG. 1. In some examples, the same neural network hardware is used during training as will be used during operation. In some examples, however, different neural network hardware may be used during training, and the weights, functions, or other attributes determined during training may be stored for use by other neural network hardware during operation.

Examples of training can be described mathematically. For example, consider input data at a time instant (n), given as:

$$X(n)=[x_1(n),x_2(n), \ldots x_N(n)]^T$$

the center vector for each element in hidden layer(s) of the neural network (e.g., combiner 102, combiner 104, combiner 106, and combiner 108 of FIG. 1) may be denoted as $C_i$ (for $i=1, 2, \ldots, H$, where H is the element number in the hidden layer).

The output of each element in a hidden layer may then be given as:

$$h_i(n)=f_i(\|X(n)-C_i\|) \text{ for } (i=1,2, \ldots, H) \quad (1)$$

The connections between a last hidden layer and the output layer may be weighted. Each element in the output layer may have a linear input-output relationship such that it may perform a summation (e.g., a weighted summation). Accordingly, an output of the i'th element in the output layer at time n may be written as:

$$y_i(n)=\Sigma_{j=1}^{H}W_{ij}h_j(n)=\Sigma_{j=1}^{H}W_{ij}f_j(\|X(n)-C_j\|) \quad (2)$$

for $(i=1, 2, \ldots, L)$ and where L is the element number of the output layer and $W_{ij}$ the connection weight between the j'th element in the hidden layer and the i'th element in the output layer.

Generally, a neural network architecture (e.g., the neural network 100 of FIG. 1) may include a number of elements and may have center vectors which are distributed in the input domain such that the neural network may approximate nonlinear multidimensional functions and therefore may approximate forward mapping an inverse mapping between two code words (e.g., from an N-bit input to an L-bit output). Generally, the choice of transfer function used by elements in the hidden layer may not affect the mapping performance of the neural network, and accordingly, a function may be used which may be implemented conveniently in hardware in some examples. For example, a thin-plate-spline function and/or a Gaussian function may be used in various examples and may both provide adequate approximation capabilities. Other functions may also be used.

Examples of neural networks may accordingly be specified by attributes (e.g., parameters). In sonic examples, two sets of parameters may be used to specify a neural network: connection weights and center vectors (e.g., thresholds). The parameters may be determined from selected input data (e.g., encoded input data) by solving an optimization function. An example optimization function may be given as:

$$E = \sum_{n=1}^{M} \|Y(n) - \overline{Y(n)}\|^2 \quad (3)$$

where M is a number of trained input vector (e.g., trained encoded data inputs) and Y(n) is an output vector computed from the sample input vector using Equations 1 and 2 above, and $\overline{Y(n)}$ is the corresponding desired (e.g., known) output vector. The output vector Y(n) may be written as:

$$Y(n)=[y_1(n),y_2(n), \ldots y_N(n)]^T$$

Various methods (e.g., gradient descent procedures) may be used to solve the optimization function. However, in some examples, another approach may be used to determine the parameters of a neural network, which may generally include two steps—(1) determining center vectors $C_i$ ($i=1, 2, \ldots, H$) and (2) determining the weights.

In some examples, the center vectors may be chosen from a subset of available sample vectors. In such examples, the number of elements in the hidden layer(s) may be relatively large to cover the entire input domain. Accordingly, in some examples, it may be desirable to apply k-means cluster algorithms. Generally, k-means cluster algorithms distribute the center vectors according to the natural measure of the attractor (e.g., if the density of the data points is high, so is the density of the centers). k-means cluster algorithms may find a set of cluster centers and partition the training samples into subsets. Each cluster center may be associated with one of the H hidden layer elements in this network. The data may be partitioned in such a way that the training points are assigned to the cluster with the nearest center. The cluster center corresponding to one of the minima of an optimization function. An example optimization function for use with a k-means cluster algorithm may be given as:

$$E_{k\_means}=\Sigma_{j=1}^{H}\Sigma_{n=1}^{M}B_{jn}\|X(n)-C_j\|^2 \quad (4)$$

where $B_{jn}$ is the cluster partition or membership function forming an H×M matrix. Each column may represent an available sample vector (e.g., known input data) and each row may represent a cluster. Each column may include a single '1' in the row corresponding to the cluster nearest to that training point, and zeros elsewhere.

The center of each cluster may be initialized to a different randomly chosen training point. Then each training example may be assigned to the element nearest to it. When all training points have been assigned, the average position of the training point for each cluster may be found and the cluster center is moved to that point. The clusters may become the desired centers of the hidden layer elements.

In some examples, for some transfer functions (e.g., the Gaussian function), the scaling factor σ may be determined, and may be determined before determining the connection weights. The scaling factor may be selected to cover the training points to allow a smooth fit of the desired network outputs. Generally, this refers to any point within the convex hull of the processing element centers may significantly activate more than one element. To achieve this goal, each hidden layer element may activate at least one other hidden layer element to a significant degree. An appropriate method to determine the scaling parameter σ may be based on the P-nearest neighbor heuristic, which may be given as, $$\sigma_i = \frac{1}{P}\sum_{j=1}^{P}\|C_j - C_i\|^2$$

$$(i = 1, 2, \ldots, H)$$

where $C_j$ (for i=1, 2, ..., H) are the P-nearest neighbors of $C_i$.

The connection weights may additionally or instead be determined during training. In an example of a neural network, such as neural network 100 of FIG. 1, having one hidden layer of weighted connections an output elements which are summation units, the optimization function of Equation 3 may become a linear least-squares problem once the center vectors and the scaling parameter have been determined. The linear least-squares problem may be written as $$\min_W \sum_{n=1}^{M}\|Y(n) - \overline{Y(n)}\|^2 = \min_W \sum_{n=1}^{M}\|WF - \hat{Y}\|^2 \quad (5)$$

where W={Wij} is the L×H matrix of the connection weights, F is an H×M matrix of the outputs of the hidden layer processing elements and whose matrix elements are computed using $$F_{in} = f_i(\|X(n) - C_i\|) \ (i=1,2,\ldots,H; n=1,2,\ldots,M)$$

and $\hat{Y} = [\hat{Y}(1), \hat{Y}(2), \ldots, \hat{Y}(M)]$ is the L×M matrix of the desired (e.g., known) outputs. The connection weight matrix W may be found from Equation 5 and may be written as follows:

$$\overline{W} = \hat{Y}F^{+} = \hat{Y}\lim_{\alpha \to 0}F^T(FF^T + \alpha I)^{-1}$$

where $F^+$ is the pseudo-inverse of F. In this manner, the above may provide a batch-processing method for determining the connection weights of a neural network. It may be applied, for example, where all input sample sets are available at one time. In some examples, each new sample set may become available recursively, such as in the recursive-least-squares algorithms (RLS). In such cases, the connection weights may be determined as follows.

First, connection weights may be initialized to any value (e.g., random values may be used).

The output vector Y(n) may be computed using Equation 2. The error term $e_i(n)$ of each output element in the output layer may be computed as follows:

$$e_i(n) = y_i(n) - \hat{Y}_i(n) \ (i=1,2,\ldots,L)$$

The connection weights may then be adjusted based on the error term, for example as follows:

$$W_{ij}(n+1) = W_{ij}(n) + \gamma e_i(n) f_j(\|X(n) - C_j\|)$$

(i=1,2, ..., L; j=1,2, ..., M)

where γ is the learning-rate parameter which may be fixed or time-varying.

The total error may be computed based on the output from the output layer and the desired (known) data:

$$\epsilon = \|Y(n) - \overline{Y(n)}\|^2$$

The process may be iterated by again calculating a new output vector, error term, and again adjusting the connection weights. The process may continue until weights are identified which reduce the error to equal to or less than a threshold error.

Accordingly, the neural network 100 of FIG. 1 may be trained to determine parameters (e.g., weights) for use by the neural network 100 to perform a particular mapping between input and output data. For example, training the neural network 100 may provide one set of parameters to use when decoding encoded data that had been encoded with a particular encoding technique (e.g., low density parity check coding (LDPC), Reed-Solomon coding, Bose-Chaudhuri-Hocquenghem (BCH), and/or Polar coding). The neural network 100 (and/or another neural network) may be trained multiple times, using different known input/output data pairs, for example. Multiple trainings may result in multiple sets of connection weights. For example, a different set of weights may be determined for each of multiple encoding techniques—e.g., one set of weights may be determined for use with decoding LDPC encoded data and another set of weights may be determined for use with decoding BCH encoded data.

Recall that the structure of neural network 100 of FIG. 1 is provided by way of example only. Other multilayer neural network structures may be used in other examples. Moreover, the training procedures described herein are also provided by way of example. Other training techniques (e.g., learning algorithms) may be used, for example, to solve the local minimum problem and/or vanishing gradient problem. Determined weights and/or vectors for each decoder may be obtained by an off-line learning mode of the neural network, which may advantageously provide more resources and data.

In examples of supervised learning, the input training samples: $[x_1(n), x_2(n), \ldots x_N(n)]$ may be generated by passing the encoded samples $[b_1(n), b_2(n), \ldots b_N(n)]$ through some noisy channels and/or adding noise. The supervised output samples may be the corresponding original code $[a_1(n), a_2(n), \ldots a_L(n)]$ which may be used to generate $[b_1(n), b_2(n), \ldots b_N(n)]$ by the encoder. Once these parameters are determined in offline mode, the desired decoded code-word can be obtained from input data utilizing the neural network (e.g., computing equation 2), which may avoid complex iterations and feedback decisions used in traditional error-correcting decoding algorithms. In this manner, neural networks described herein may provide a reduction in processing complexity and/or latency, because some complexity has been transferred to an off-line training process which is used to determine the weights and/or functions which will be used. Further, the same neural network (e.g., the neural network 100 of FIG. 1) can be used to decode an input code-word encoded from any of multiple error correction encoder by selecting different weights that were obtained by the training for the particular error correction technique employed. In this manner, neural networks may serve as a universal decoder for multiple encoder types.

Figure 2:
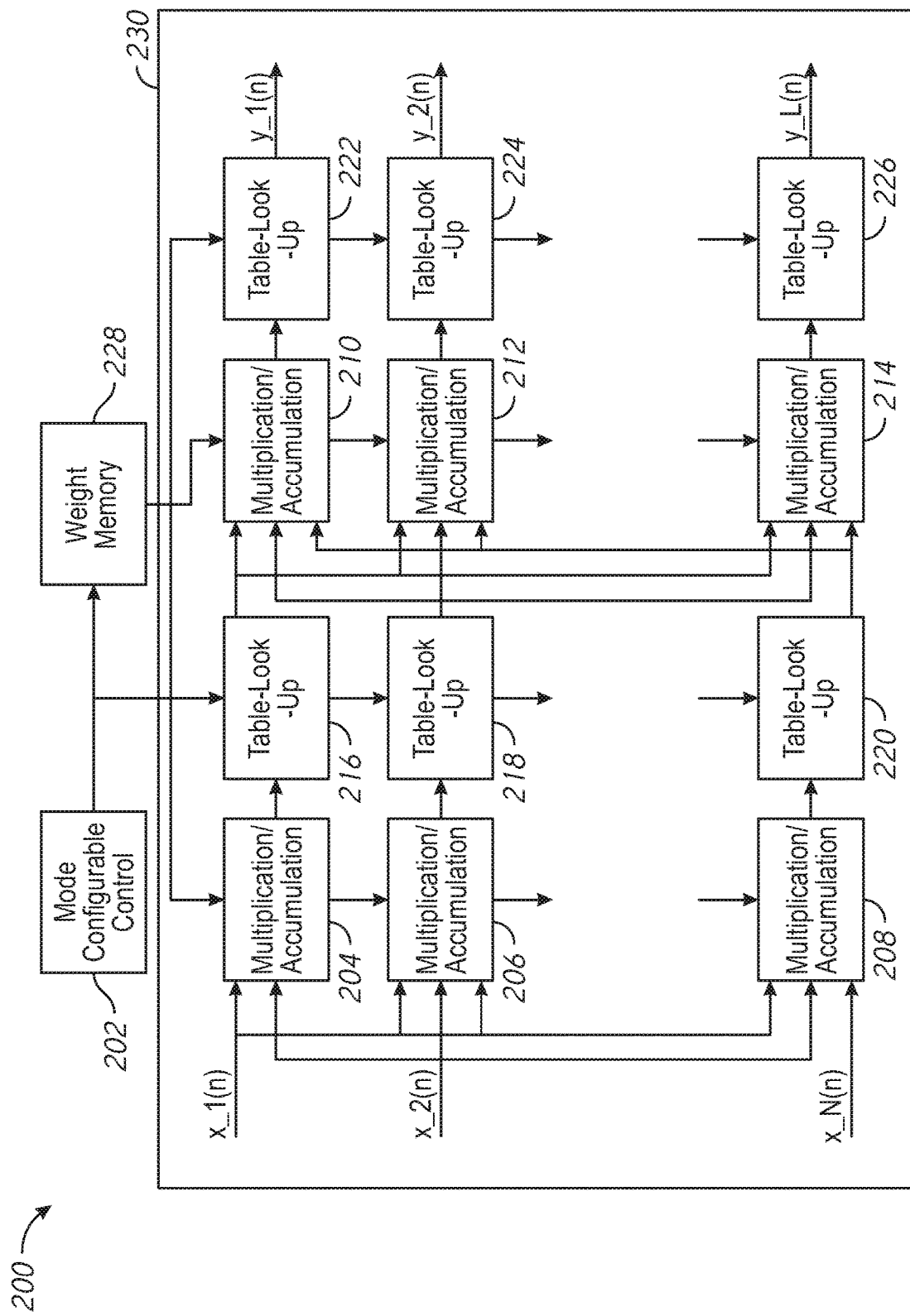
FIG. 2 is a schematic illustration of a hardware implementation of a neural network arranged in accordance with examples described herein.

FIG. 2 is a schematic diagram of hardware implementation of a neural network 200. The hardware implementation of the neural network 200, may be used, for example, to implement one or more neural networks, such as the neural network 100 of FIG. 1. The hardware implementation of the neural network 200 includes a processing unit 230 having two stages—a first stage which may include multiplication/accumulation unit 204, table look-up 216, multiplication/accumulation unit 206, table look-up 218, and multiplication/accumulation unit 208, and table look-up 220. The processing unit 230 includes a second stage, coupled to the first stage in series, which includes multiplication/accumulation unit 210, table look-up 222, multiplication/accumulation unit 212, table look-up 224, multiplication/accumulation unit 214, and table look-up 226. The hardware implementation of the neural network 200 further includes a mode configurable control 202 and a weight memory 228.

The processing unit 230 may receive input data (e.g. $x_1(n), x_2(n), \ldots x_N(n)$) from a memory device, communication transceiver and/or other component. In some examples, the input data may be encoded in accordance with an encoding technique. The processing unit 230 may function to process the encoded input data to provide output data—e.g., $y_1(n), y_2(n), \ldots y_L(n)$. The output data may be the decoded data (e.g., an estimate of the decoded data) corresponding to the encoded input data in some examples. The output data may be the data corresponding to the encoded input data, but having reduced and/or modified noise.

While two stages are shown in FIG. 2—a first stage including N multiplication/accumulation units and N table look-ups, and a second stage including L multiplication/accumulation units and L table look-ups—any number of stages, and numbers of elements in each stage may be used. In the example of FIG. 2, one multiplication/accumulation unit followed by one table look-up may be used to implement a processing element of FIG. 1. For example, the multiplication/accumulation unit 204 coupled in series to the table look-up 216 may be used to implement the combiner 102 of FIG. 1.

Generally, each multiplication/accumulation unit of FIG. 2 may be implemented using one or more multipliers and one or more adders. Each of the multiplication unit/accumulation units of FIG. 2 may include multiple multipliers, multiple accumulation unit, or and/or multiple adders. Any one of the multiplication unit/accumulation units of FIG. 2 may be implemented using an arithmetic logic unit (ALU). In some examples, any one of the multiplication unit/accumulation units may include one multiplier and one adder that each perform, respectively, multiple multiplications and multiple additions. The input-output relationship of an example multiplication/accumulation unit may be written as:

$$Z_{out} \Sigma_{i=1}^{I} W_i * Z_{in}(i) \qquad (6)$$

where "I" is the number of multiplications to be performed by the unit, $W_i$ refers to the coefficients to be used in the multiplications, and $Z_{in}(i)$ is a factor for multiplication which may be, for example, input to the system and/or stored in one or more of the table look-ups.

The table-lookups shown in FIG. 2 may generally perform a predetermined nonlinear mapping from input to output. For example, the table-lookups may be used to evaluate at least one non-linear function. In some examples, the contents and size of the various table look-ups depicted may be different and may be predetermined. In some examples, one or more of the table look-ups shown in FIG. 2 may be replaced by a single consolidated table look-up. Examples of nonlinear mappings (e.g., functions) which may be performed by the table look-ups include Gaussian functions, piece-wise linear functions, sigmoid functions, thin-plate-spline functions, multiquadratic functions, cubic approximations, and inverse multi-quadratic functions. Examples of functions have been described with reference also to FIG. 1. In some examples, selected table look-ups may be by-passed and/or may be de-activated, which may allow a table look-up and its associated multiplication/accumulation unit to be considered a unity gain element. Generally, the table-lookups may be implemented using one or more look-up tables (e.g., stored in one or more memory device(s)), which may associate an input with the output of a non-linear function utilizing the input.

Accordingly, the hardware implementation of neural network 200 may be used to convert an input code word (e.g. $x_1(n), x_2(n), \ldots x_N(n)$) to an output code word (e.g., $y_1(n), y_2(n), \ldots y_L(n)$). Examples of the conversion have been described herein with reference to FIG. 1. For example, the input code word may correspond to noisy encoded input data. The hardware implementation of the neural network 200 may utilize multiplication with corresponding weights (e.g., weights obtained during training) and look-up tables to provide the output code word. The output code word may correspond to the decoded data and/or to a version of the encoded input data having reduced and/or changed noise.

The mode configuration control 202 may be implemented using circuitry (e.g., logic), one or more processor(s), microcontroller(s), controller(s), or other elements. The mode configuration control 202 may select certain weights and/or other parameters from weight memory 228 and provide those weights and/or other parameters to one or more of the multiplication/accumulation units and/or table look-ups of FIG. 2. In some examples, weights and/or other parameters stored in weight memory 228 may be associated with particular encoding techniques. During operation, the mode configuration control 202 may be used to select weights and/or other parameters in weight memory 228 associated with a particular encoding technique (e.g., Reed-Solomon coding, BCH coding, LDPC coding, and/or Polar coding). The hardware implementation of neural network 200 may then utilize the selected weights and/or other parameters to function as a decoder for data encoded with that encoding technique. The mode configuration control 202 may select different weights and/or other parameters stored in weight memory 228 which are associated with a different encoding technique to alter the operation of the hardware implementation of neural network 200 to serve as a decoder for the different encoding technique. In this manner, the hardware implementation of neural network 200 may flexibly function as a decoder for multiple encoding techniques.

Figure 3:
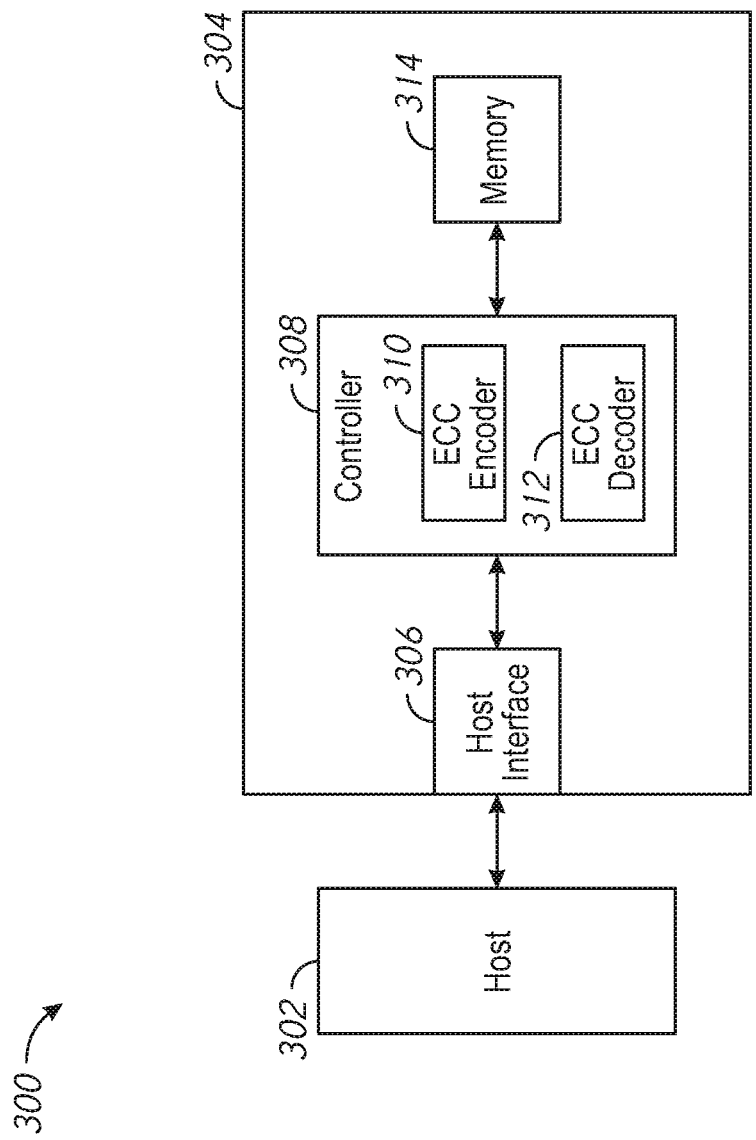
FIG. 3 is a schematic illustration of an apparatus arranged in accordance with examples described herein.

FIG. 3 is a schematic illustration of apparatus 300 (e.g., an integrated circuit, a memory device, a memory system, an electronic device or system, a smart phone, a tablet, a computer, a server, an appliance, a vehicle, etc.) according to an embodiment of the disclosure. The apparatus 300 may generally include a host 302 and a memory system 304.

The host 302 may be a host system such as a personal laptop computer, a desktop computer, a digital camera, a mobile telephone, or a memory card reader, among various other types of hosts. The host 302 may include a number of memory access devices (e.g., a number of processors). The host 302 may also be a memory controller, such as where memory system 304 is a memory device (e.g., a memory device having an on-die controller).

The memory system 304 may be a solid state drive (SSD) or other type of memory and may include a host interface 306, a controller 308 (e.g., a processor and/or other control circuitry), and a number of memory device(s) 310. The memory system 304, the controller 308, and/or the memory device(s) 310 may also be separately considered an "apparatus." The memory device(s) 310 may include a number of solid state memory devices such as NAND flash devices, which may provide a storage volume for the memory system 304. Other types of memory may also be used.

The controller 308 may be coupled to the host interface 306 and to the memory device(s) 310 via a plurality of channels to transfer data between the memory system 304 and the host 302. The interface 306 may be in the form of a standardized interface. For example, when the memory system 304 is used for data storage in the apparatus 300, the interface 306 may be a serial advanced technology attachment (SATA), peripheral component interconnect express (PCIe), or a universal serial bus (USB), among other connectors and interfaces. In general, interface 306 provides an interface for passing control, address, data, and other signals between the memory system 304 and the host 302 having compatible receptors for the interface 306.

The controller 308 may communicate with the memory device(s) 314 (which in some embodiments can include a number of memory arrays on a single die) to control data read, write, and erase operations, among other operations. The controller 308 may include a discrete memory channel controller for each channel (not shown in FIG. 3) coupling the controller 308 to the memory device(s) 314. The controller 308 may include a number of components in the form of hardware and/or firmware (e.g., one or more integrated circuits) and/or software for controlling access to the memory device(s) 314 and/or for facilitating data transfer between the host 302 and memory device(s) 314.

The controller 308 may include an ECC encoder 310 for encoding data bits written to the memory device(s) 314 using one or more encoding techniques. The ECC encoder 310 may include a single parity check (SPC) encoder, and/or an algebraic error correction circuit such as one of the group including a Bose-Chaudhuri-Hocquenghem (BCH) ECC encoder and/or a Reed Solomon ECC encoder, among other types of error correction circuits. The controller 308 may further include an ECC decoder 312 for decoding encoded data, which may include identifying erroneous cells, converting erroneous cells to erasures, and/or correcting the erasures. The memory device(s) 314 may, for example, include one or more output buffers which may read selected data from memory cells of the memory device(s) 314. The output buffers may provide output data, which may be provided as encoded input data to the ECC decoder 312. The neural network 100 of FIG. 1 and/or the hardware implementation of neural network 200 of FIG. 2 may be used to implement the ECC decoder 312 of FIG. 3, for example. In various embodiments, the ECC decoder 312 may be capable of decoding data for each type of encoder in the ECC encoder 310. For example, the weight memory 228 of FIG. 2 may store parameters associated with multiple encoding techniques which may be used by the ECC encoder 310, such that the hardware implementation of neural network 200 may be used as a 'universal decoder' to decode input data encoded by the ECC encoder 310, using any of multiple encoding techniques available to the ECC encoder.

The ECC encoder 310 and the ECC decoder 312 may each be implemented using discrete components such as an application specific integrated circuit (ASIC) or other circuitry, or the components may reflect functionality provided by circuitry within the controller 308 that does not necessarily have a discrete physical form separate from other portions of the controller 308. Although illustrated as components within the controller 308 in FIG. 3, each of the ECC encoder 310 and ECC decoder 312 may be external to the controller 308 or have a number of components located within the controller 308 and a number of components located external to the controller 308.

The memory device(s) 314 may include a number of arrays of memory cells (e.g., non-volatile memory cells). The arrays can be flash arrays with a NAND architecture, for example. However, embodiments are not limited to a particular type of memory array or array architecture. Floating-gate type flash memory cells in a NAND architecture may be used, but embodiments are not so limited. The cells may be multi-level cells (MLC) such as triple level cells (TLC) which store three data bits per cell. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

According to a number of embodiments, controller 308 may control encoding of a number of received data bits according to the ECC encoder 310 that allows for later identification of erroneous bits and the conversion of those erroneous bits to erasures. The controller 308 may also control programming the encoded number of received data bits to a group of memory cells in memory device(s) 314.

The apparatus shown in FIG. 3 may be implemented in any of a variety of products employing processors and memory including for example cameras, phones, wireless devices, displays, chip sets, set top boxes, gaming systems, vehicles, and appliances. Resulting devices employing the memory system may benefit from examples of neural networks described herein to perform their ultimate user function.

From the foregoing it will be appreciated that, although specific embodiments have been described herein for purposes of illustration, various modifications may be made while remaining with the scope of the claimed technology. Certain details are set forth herein to provide an understanding of described embodiments of technology. However, other examples may be practiced without various of these particular details. In some instances, well-known circuits, control signals, timing protocols, neural network structures, algorithms, and/or software operations have not been shown in detail in order to avoid unnecessarily obscuring the described embodiments. Other embodiments may be utilized, and other changes may be made, without departing from the spirit or scope of the subject matter presented here.

Figure 4:
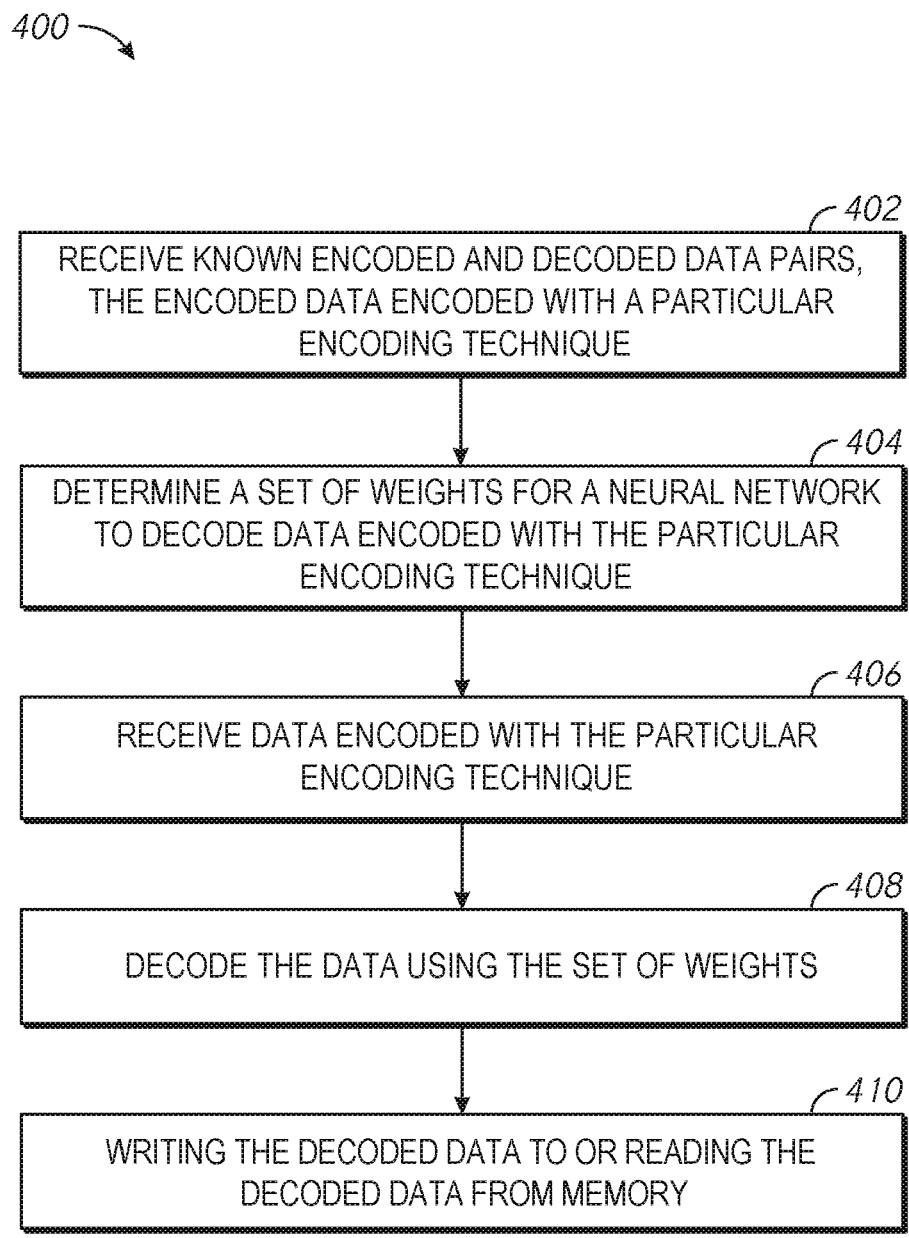
FIG. 4. is a flowchart of a method arranged in accordance with examples described herein.

FIG. 4 is a flowchart of a method arranged in accordance with examples described herein. The example method may include block 402, which may be followed by block 404, which may be followed by block 406, which may be followed by block 408, which may be followed by block 410. Additional, fewer, and/or different blocks may be used in other examples, and the order of the blocks may be different in other examples.

Block 402 recites "receive known encoded and decoded data pairs, the encoded data encoded with a particular encoding technique." The known encoded and decoded data pairs may be received by a computing device that includes a neural network, such as the neural network 100 of FIG. 1 and/or the neural network 200 of FIG. 2 and/or the ECC decoder 312 of FIG. 3. Signaling indicative of the set of data pairs may be provided to the computing device.

Block 404 may follow block 402. Block 404 recites "determine a set of weights for a neural network to decode data encoded with the particular encoding technique." For example, a neural network (e.g., any of the neural networks described herein) may be trained using the encoded and decoded data pairs received in block 402. The weights may be numerical values, which, when used by the neural network, allow the neural network to output decoded data corresponding encoded input data encoded with a particular encoding technique. The weights may be stored, for example, in the weight memory 228 of FIG. 2. In some examples, training may not be performed, and an initial set of weights may simply be provided to a neural network, e.g., based on training of another neural network.

In some examples, multiple sets of data pairs may be received (e.g., in block 402), with each set corresponding to data encoded with a different encoding technique. Accordingly, multiple sets of weights may be determined (e.g., in block 404), each set corresponding to a different encoding technique. For example, one set of weights may be determined which may be used to decode data encoded in accordance with LDPC coding while another set of weights may be determined which may be used to decode data encoded with BCH coding.

Block 406 may follow block 404. Block 406 recites "receive data encoded with the particular encoding technique." For example, data (e.g., signaling indicative of data) encoded with the particular encoding technique may be retrieved from a memory of a computing device and/or received using a wireless communications receiver. Any of a variety of encoding techniques may have been used to encode the data.

Block 408 may follow block 406. Block 408 recites "decode the data using the set of weights." By processing the encoded data received in block 406 using the weights, which may have been determined in block 404, the decoded data may be determined. For example, any neural network described herein may be used to decode the encoded data (e.g., the neural network 100 of FIG. 1, neural network 200 of FIG. 2, and/or the FCC decoder 312 of FIG. 3). In some examples, a set of weights may be selected that is associated with the particular encoding technique used to encode the data received in block 406. The set of weights may be selected from among multiple available sets of weights, each for use in decoding data encoded with a different encoding technique.

Block 410 may follow block 408. Block 410 recites "writing the decoded data to or reading the decoded data from memory." For example, data decoded in block 408 may be written to a memory, such as the memory 314 of FIG. 3. In some examples, instead of or in addition to writing the data to memory, the decoded data may be transmitted to another device (e.g., using wireless communication techniques). While block 410 recites memory, in some examples any storage device may be used.

In some examples, blocks 406-410 may be repeated for data encoded with different encoding techniques. For example, data may be received in block 406, encoded with one particular encoding technique (e.g., LDPC coding). A set of weights may be selected that is for use with LDPC coding and provided to a neural network for decoding in block 408. The decoded data may be obtained in block 410. Data may then be received in block 406, encoded with a different encoding technique (e.g., BCH coding). Another set of weights may be selected that is for use with BCH coding and provided to a neural network for decoding in block 408. The decoded data may be obtained in block 410. In this manner, one neural network may be used to decode data that had been encoded with multiple encoding techniques.

Examples described herein may refer to various components as "coupled" or signals as being "provided to" or "received from" certain components. It is to be understood that in some examples the components are directly coupled one to another, while in other examples the components are coupled with intervening components disposed between them. Similarly, signal may be provided directly to and/or received directly from the recited components without intervening components, but also may be provided to and/or received from the certain components through intervening components.

What is claimed is:

1. An apparatus comprising:
    an encoder configured to encode input data using encoded bits in accordance with an encoding technique and to provide encoded input data;
    a memory configured to receive the encoded input data from the encoder and configured to store the encoded input data; and
    combiners configured to receive the encoded input data from the memory and further configured to combine the encoded input data among a set of predetermined weights, wherein the combiners are further configured to provide encoded data with reduced noise, the noise introduced by the memory.

2. The apparatus of claim 1, wherein, in storing the encoded input data, noise is introduced into the encoded input data.

3. The apparatus of claim 1, wherein the combiners comprise:
    a first stage of combiners configured to receive the encoded input data and evaluate at least one non-linear function using combinations of the encoded input data to provide intermediate data; and
    at least a second stage of combiners configured to receive the intermediate data and combine the intermediate data using a set of predetermined set of weights to provide the encoded data with reduced noise.

4. The apparatus of claim 3, wherein the first stage of combiners and second stage of combiners comprises a first plurality of multiplication/accumulation units, the first plurality of multiplication/accumulation units each configured to multiply at least one bit of the encoded input data with at least one of the set of predetermined weights and sum multiple weighted bits of the encoded input data.

5. The apparatus of claim 4, wherein the first stage of combiners further comprises a first plurality of table look-ups, the first plurality of table look-ups each configured to look-up at least one intermediate data value corresponding to an output of a respective one of the first plurality of multiplication/accumulation units based on at least one non-linear function.

6. The apparatus of claim 1, wherein the set of predetermined weights based at least in part on the encoding technique associated with the encoded input data.

7. The apparatus of claim 1, wherein the set of predetermined weights are based on training of a neural network using known noisy encoded data and encoded data pairs.

8. The apparatus of claim 1, wherein the encoding technique comprises Reed-Solomon coding, Bose-Chaudhuri-Hocquenghem (BCH) coding, low-density parity check (LDPC) coding, Polar coding, or combinations thereof.

9. The apparatus of claim 1, wherein the memory is in communication with the combiners, wherein, in communicating the encoded input data to the combiners, noise is introduced during transmission to the combiners.

10. The apparatus of claim 1, wherein the memory is further configured to store multiple sets of predetermined weights, including the set of predetermined weights.

11. A method comprising:
  passing known encoded data through noisy channels to provide known noisy encoded data, wherein the known encoded data is encoded with a particular encoding technique;
  receiving, at a computing device that comprises a neural network, signaling indicative of a set of encoded data pairs comprising the known encoded data;
  determining, for the neural network, a set of weights that modifies the known noisy encoded data using the signaling indicative of the set of encoded data pairs;
  transmitting signaling, from a memory of the computing device, indicative of data encoded with the particular encoding technique;
  modifying, at the neural network, the data encoded with the particular encoding technique using the set of weights to provide encoded data with reduced noise; and
  writing the encoded data with reduced noise to or reading the encoded data with reduced noise from a memory or storage medium of the computing device.

12. The method of claim 11, wherein modifying the data using the neural network using the set of weights to provide encoded data with reduced noise comprises:
  combining the data encoded with the particular encoding technique among the set of weights to provide the encoded data with reduced noise.

13. The method of claim 11, wherein the encoded data with reduced noise is an estimate of the encoded data relative to output of an encoder associated with the encoding particular technique.

14. The method of claim 11, further comprising:
  providing the encoded data with reduced noise to a decoder for decoding of the encoded data.

15. The method of claim 11, wherein the particular encoding technique comprises Reed-Solomon coding, Bose-Chaudhuri-Hocquenghem (BCH) coding, low-density parity check (LDPC) coding, Polar coding, or combinations thereof.

16. The method of claim 11, wherein determining the set of weights comprises selecting weights resulting in a minimized value of an error function between an output of the neural network and the known noisy encoded data.

17. A memory system comprising:
  memory cells configured to store encoded data associated with an encoding technique;
  output buffers configured to read selected portions of the encoded data from the memory cells and transmit corresponding output data, wherein, in transmitting the corresponding output data, noise is introduced into the output data; and
  a neural network configured to utilize initial weights selected based on encoded data pairs, the neural network configured to receive the output data and provide an estimate of encoded data with reduced noise, the noise introduced in transmitting the output data from the output buffers.

18. The memory system of claim 17, further comprising a decoder configured to decode the estimate of encoded data with the reduced noise as decoded data.

19. The memory system of claim 17, wherein the neural network is configured to use a set of weights to provide the estimate of the encoded data.

20. The memory system of claim 19, further comprising a mode configuration control configured to select the set of weights associated with the encoding technique for the neural network, the set of weights predetermined, in an offline mode, partly by passing known encoded samples associated with the encoding technique through noisy channels.

* * * * *